US012704375B2

(12) United States Patent
Attanasio et al.

(10) Patent No.: US 12,704,375 B2
(45) Date of Patent: Aug. 11, 2026

(54) DEVICE AND METHOD FOR KICKBACK PROTECTION

(71) Applicant: STMicroelectronics International N.V., Geneva (CH)

(72) Inventors: Rosario Attanasio, Barrington, IL (US); Mauro Scandiuzzo, Sunnyvale, CA (US); Haozhou Yu, Acton, MA (US); Nicola Siciliano, Winchester, MA (US); Min Kyun Kim, Seattle, WA (US)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/974,177

(22) Filed: Dec. 9, 2024

(65) Prior Publication Data

US 2026/0160553 A1 Jun. 11, 2026

(51) Int. Cl.

*G01C 21/16* (2006.01)
*B23Q 11/00* (2006.01)
*G01R 19/165* (2006.01)
*H02H 3/093* (2006.01)
*H02H 3/10* (2006.01)

(52) U.S. Cl.

CPC .......... *G01C 21/16* (2013.01); *B23Q 11/0092* (2013.01); *G01R 19/16571* (2013.01); *G01R 19/16576* (2013.01); *H02H 3/093* (2013.01); *H02H 3/10* (2013.01)

(58) Field of Classification Search

CPC ................ G01C 21/16; B23Q 11/0092; G01R 19/15671; G01R 19/16576; H02H 3/093; H02H 3/10

USPC .......................................................... 307/326

See application file for complete search history.

(56) References Cited

U.S. PATENT DOCUMENTS 4,249,117 A 2/1981 Leukhardt
2021/0078151 A1 3/2021 Huber et al.
2022/0001570 A1 1/2022 Rusch et al.
2023/0356341 A1 11/2023 Volpert
2023/0390963 A1 12/2023 Rosén et al.

*Primary Examiner* — Hal Kaplan

(74) *Attorney, Agent, or Firm* — Alston & Bird LLP

(57) ABSTRACT

In accordance with various embodiments of the present disclosure, a method for confirming kickback is provided. In some embodiments, the method for confirming kickback comprises, in response to an indication of a kickback occurrence, comparing an input current to a predetermined current threshold; if the input current is greater than the predetermined current threshold for a first predetermined amount of time, generating a kickback interrupt signal; if the input current is not greater than the predetermined current threshold, comparing an input voltage to a predetermined voltage threshold; if the input voltage is less than the predetermined voltage threshold for a second predetermined amount of time; generating a kickback interrupt signal; and if the input voltage is not less than the predetermined voltage threshold and the input current is not greater than the predetermined current threshold, generating a false positive (FP) signal.

18 Claims, 3 Drawing Sheets

300
302
COMPARE # OF KICKBACK FP EVENTS TO HIGH/LOW THRESHOLDS
>HIGH
<LOW
304
SET DELTA TO POSITIVE
306
SET DELTA TO NEGATIVE
308
ADD DELTA TO THRESHOLD
310
COMPARE THRESHOLD + DELTA TO MAX / MIN THRESHOLD VALUES
>MAX
<MIN
312
NEW THRESHOLD = MAX VALUE
314
NEW THRESHOLD = MIN VALUE
316
UPDATE THRESHOLD

DEVICE AND METHOD FOR KICKBACK PROTECTION

FIELD OF THE INVENTION

Example embodiments of the present disclosure relate generally to devices that may experience kickback and, more particularly, providing kickback protection in such devices.

BACKGROUND

There are a variety of different handheld power tools, such as drills, impact tools, circular saws, and chainsaws. Such handheld power tools may be plugged into a wall socket for power, although most handheld power tools sold now are battery powered. Such handheld power tools have a motor that rotates a rotor which in turn moves a tool component (e.g., a drill bit, a saw blade, etc.) against a workpiece (e.g., screw to be rotated, wood to be cut).

User safety is very important in the design and operation of handheld power tools. One potential safety issue is kickback, which can result in serious injury or death if not properly detected and prevented. Kickback is a sudden, backward movement opposite to the direction of rotation of the power tool rotor to the point where the rotor is completely stuck and the force applied by the motor is transferred to the operator. It is known to include anti-kickback safety systems in handheld power tools. The goal of such anti-kickback systems is to detect kickback in 250 milliseconds (ms) or less.

Some such existing anti-kickback systems use accelerometers and gyros or microelectromechanical systems (MEMS) sensors in one or more axes of the power tool. Some others are based on mechanical systems such as clutches that disengage the rotor or mechanical spring-mass accelerometers. Other algorithms use a combination of motor current sensing and accelerometers.

Known MEMS-based systems measure sensor values against a predetermined threshold or calculate total kinematic motion and trip if this threshold is reached. Tripping means that motor power is cut or a brake is applied. These systems may be prone to false positives (FPs), where the MEMS sensors indicate a kickback but a kickback is not actually occurring. Such false positives may result, for example, from the way the operator is using the tool (e.g., applying a lot of pressure) or the type of workpiece (e.g., very hard wood).

Applicant has identified many technical challenges and difficulties associated with providing kickback detection in power tools. Through applied effort, ingenuity, and innovation, Applicant has solved problems related to providing kickback detection in power tools by developing solutions embodied in the present disclosure, which are described in detail below.

BRIEF SUMMARY

Various embodiments described herein relate to devices and methods for kickback detection.

In accordance with various embodiments of the present disclosure, a method for confirming kickback is provided. In some embodiments, the method for confirming kickback comprises, in response to an indication of a kickback occurrence, comparing an input current to a predetermined current threshold; if the input current is greater than the predetermined current threshold for a first predetermined amount of time, generating a kickback interrupt signal; if the input current is not greater than the predetermined current threshold, comparing an input voltage to a predetermined voltage threshold; if the input voltage is less than the predetermined voltage threshold for a second predetermined amount of time; generating a kickback interrupt signal; and if the input voltage is not less than the predetermined voltage threshold and the input current is not greater than the predetermined current threshold, generating a false positive (FP) signal.

In some embodiments, the input current comprises a battery current or an alternating current (AC) line current and the input voltage comprises a battery voltage or an AC line voltage.

In some embodiments, the indication of a kickback occurrence is based on one or more outputs from an inertial measurement unit (IMU).

In some embodiments, the indication of a kickback occurrence is based on at least one of the one or more outputs from the IMU being greater than a predetermined IMU threshold for a third predetermined amount of time, the one or more outputs from the IMU comprise three outputs and each of the three outputs corresponds to an axis.

In some embodiments, the method further comprises maintaining a running total of the generated FP signals.

In some embodiments, the method further comprises comparing the running total of the generated FP signals to a first FP threshold, and, if the running total of the generated FP signals is greater than the first FP threshold, determining an adjusted value of the predetermined IMU threshold by adding a respective predetermined delta to the predetermined IMU threshold.

In some embodiments, the method further comprises comparing the running total of the generated FP signals to a second FP threshold, and, if the running total of the generated FP signals is less than the second FP threshold, determining an adjusted value of the predetermined IMU threshold by subtracting a respective predetermined delta from the predetermined IMU threshold.

In some embodiments, the method further comprises, if the running total of the generated FP signals is greater than the first FP threshold and the determined adjusted value of the predetermined IMU threshold is greater than a predetermined maximum value, setting the predetermined IMU threshold to the predetermined maximum value, and, if the running total of the generated FP signals is less than the second FP threshold and the determined adjusted value of the predetermined IMU threshold is less than a predetermined minimum value, setting the predetermined IMU threshold to the predetermined minimum value.

In some embodiments, the method further comprises comparing the running total of the generated FP signals to a first FP threshold, and, if the running total of the generated FP signals is greater than the first FP threshold, applying an artificial intelligence data model to determine an adjusted value of the predetermined IMU threshold.

In accordance with various embodiments of the present disclosure, a device for confirming kickback is provided. In some embodiments, the device for confirming kickback comprises an inertial measurement unit (IMU) and a finite state machine. The FSM is configured to compare one or more outputs from the IMU to a predetermined IMU threshold; if any one of the one or more outputs from the IMU is greater than the predetermined IMU threshold for a first predetermined amount of time, compare an input current to a predetermined current threshold; if the input current is greater than the predetermined current threshold for a second predetermined amount of time, generate a kickback interrupt signal; if the input current is not greater than the predetermined current threshold, compare an input voltage to a predetermined voltage threshold; if the input voltage is less than the predetermined voltage threshold for a third predetermined amount of time; generate a kickback interrupt signal; and if the input voltage is not less than the predetermined voltage threshold for the third predetermined amount of time and the input current is not greater than the predetermined current threshold for the second predetermined amount of time, generate a false positive (FP) signal.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
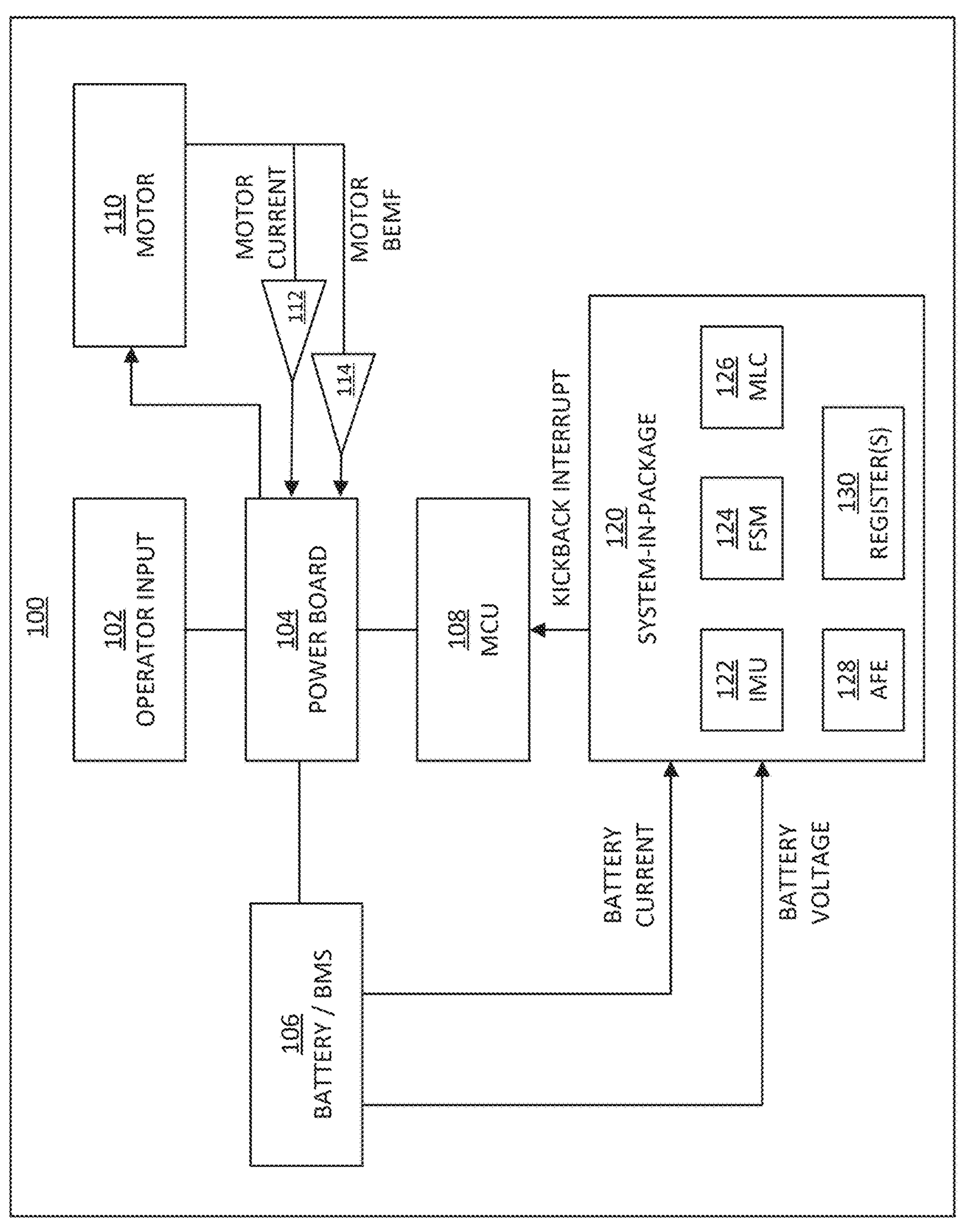
FIG. 1 is a block diagram of an example device for providing kickback detection in power tools, in accordance with some embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

Various embodiments of the present disclosure overcome the above technical challenges and difficulties and provide various technical improvements and advantages based on, for example, but not limited to, providing example devices and methods for providing kickback detection in power tools. Various embodiments of the present disclosure may be implemented in any suitable power tool, including battery powered and AC powered tools, and including but not limited to drills, impact tools, circular saws, and chainsaws.

In various embodiments, input voltage and input current are used to confirm a kickback detection event detected by the MEMS sensors. In various embodiments, the input voltage and input current are compared to corresponding predetermined voltage and current thresholds to confirm that a kickback has occurred. In various embodiments, either the AC input voltage/current or the DC battery voltage/current are compared to the predetermined thresholds, depending on whether the tool is battery powered or not.

By confirming the kickback indication from the MEMS sensors using input voltage and current, false positives can be identified in various embodiments. In various embodiments, when the kickback indication from the MEMS sensors is not confirmed, this indicates a false positive and the tool is not shut off. In various embodiments, the number of false positives is tracked and the predetermined thresholds used to detect kickback are adjusted when the number of false positive is too high or too low.

In various embodiments, an artificial intelligence (AI) machine learning (ML) model may be used to adjust the kickback thresholds as needed to provide better, faster detection with fewer false positives. Thus, embodiments of the present disclosure benefit from using an ML model to improve detection without the slow performance that comes from using an ML model for the kickback detection itself.

FIG. 1 illustrates a block diagram of an example device for providing kickback detection in power tools, in accordance with some embodiments of the present disclosure. The example device 100 of FIG. 1 may be, for example, a handheld, battery-powered power tool such as a drill, impact tool, circular saw, or chainsaw. The example device of FIG. 1 comprises an operator input 102, such as a trigger switch or the like, which activates the device 100. Typically, a user squeezes or otherwise engages the operator input 102 to begin operation of the device and releases or otherwise disengages the operator input 102 to cease operation of the device. During operation, power provided to the motor 110 causes the motor shaft (not illustrated) to rotate which in turn causes some tool component (e.g., blade, drill chuck and bit, etc.) (not illustrated) to rotate or otherwise move.

The example device 100 of FIG. 1 further comprises a microcontroller (MCU) 108 that controls the operation of the device 100. The example device 100 of FIG. 1 further comprises a power board 104 which receives operational power from a battery 106 when the device 100 is actuated and directs operational power to the motor 110. In various embodiments, the battery 106 may comprise any suitable type of battery or battery pack, such as a rechargeable lithium-ion battery pack. In various alternative embodiments, the battery is omitted and the device is powered by plugging the device into an AC power outlet. The battery 106 typically includes a battery management system (BMS) which provides cell voltage balancing and battery status monitoring (such as state of charge (SoC) and state of health (SoH).

In various embodiments, the motor 110 may be any suitable type of motor, such as a brushless direct current (DC) motor. In various embodiments, the motor current is fed back to the power board 104, such a through an operational amplifier (op-amp) 112, and the motor voltage (also termed back electromotive force (BEMF)) is fed back to the power board 104, such a through an op-amp 114, for motor power/torque control.

In various embodiments, the device 100 further comprises a system-in-package (SIP) 120. A SIP typically involves the integration of multiple integrated circuits (ICs) and passive components into a single chip carrier package, thereby combining various functional blocks within a compact form factor. In the illustrated embodiment, the SIP 120 comprises an inertial measurement unit (IMU) 122, a finite state machine (FSM) 124, a machine learning core (MLC) 126, an analog front end (AFE) 128, and one or more data registers 130. Alternatively, embodiments of the present disclosure may provide some or all of this functionality of the SIP 120 in a separated form factor.

In various embodiments, the IMU 122 comprises one or more accelerometers and one or more gyroscopes and provides gravitational force and motion measurements to the FSM (such as via an analog-to-digital controller (ADC) (not illustrated)). In various embodiments, the FSM 124 is a computational model that can be (and is in various embodiments of the disclosure) implemented using sequential logic circuits. Generally, an FSM is faster and uses less power than, for example, providing such functionality in an MCU. In various embodiments, the FSM uses the gravitational force and motion measurements from the IMU to detect kickback and then compares the input voltage and input current (received via the AFE (which typically includes opamps and one or more ADCs) to the predetermined thresholds to confirm kickback, as described further below. In various embodiments, the MLC 126 is a hardware processing engine that uses decision tree learning to perform machine learning on sensors. In various embodiments, the MLC 126 runs a machine learning model to update the IMU thresholds used for kickback detection, as described below. In various embodiments, the AFE 128 is a circuit that conditions analog signals and connects them to digital systems.

In various embodiments, the SIP 120 can be placed inside the battery pack or can be mounted on the main PCB inside the power tool. In various embodiments, the machine learning model can run inside the IMU 122, the MLC 126, or inside an internal (to the SIP) or external MCU. In various embodiments, the MCU 108 can be the main MCU that controls the operation of the device or an MCU used inside the BMS.

Figure 2:
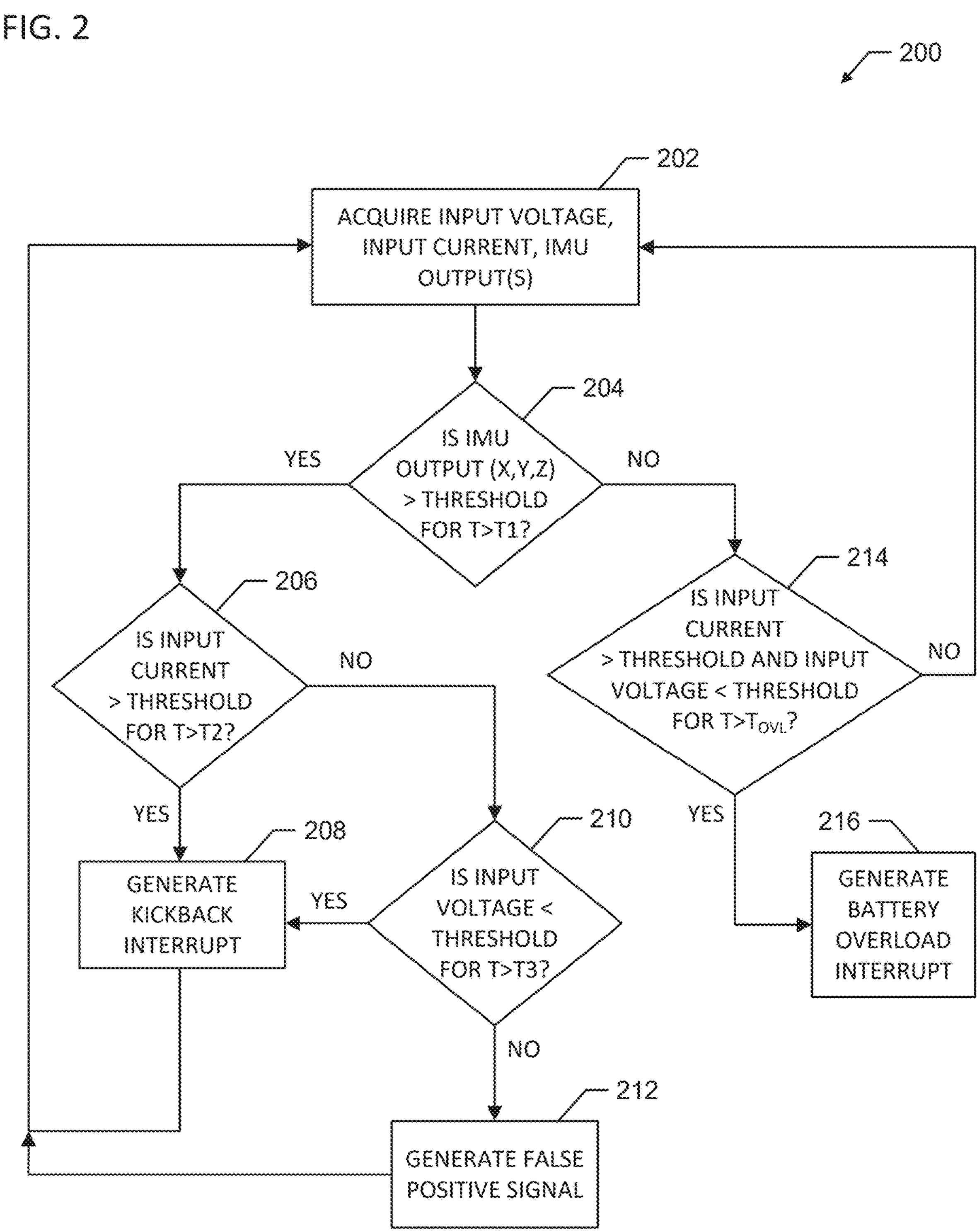
FIG. 2 provides an example flow diagram illustrating an example method for providing kickback detection in power tools, in accordance with some embodiments of the present disclosure.
Figure 3:
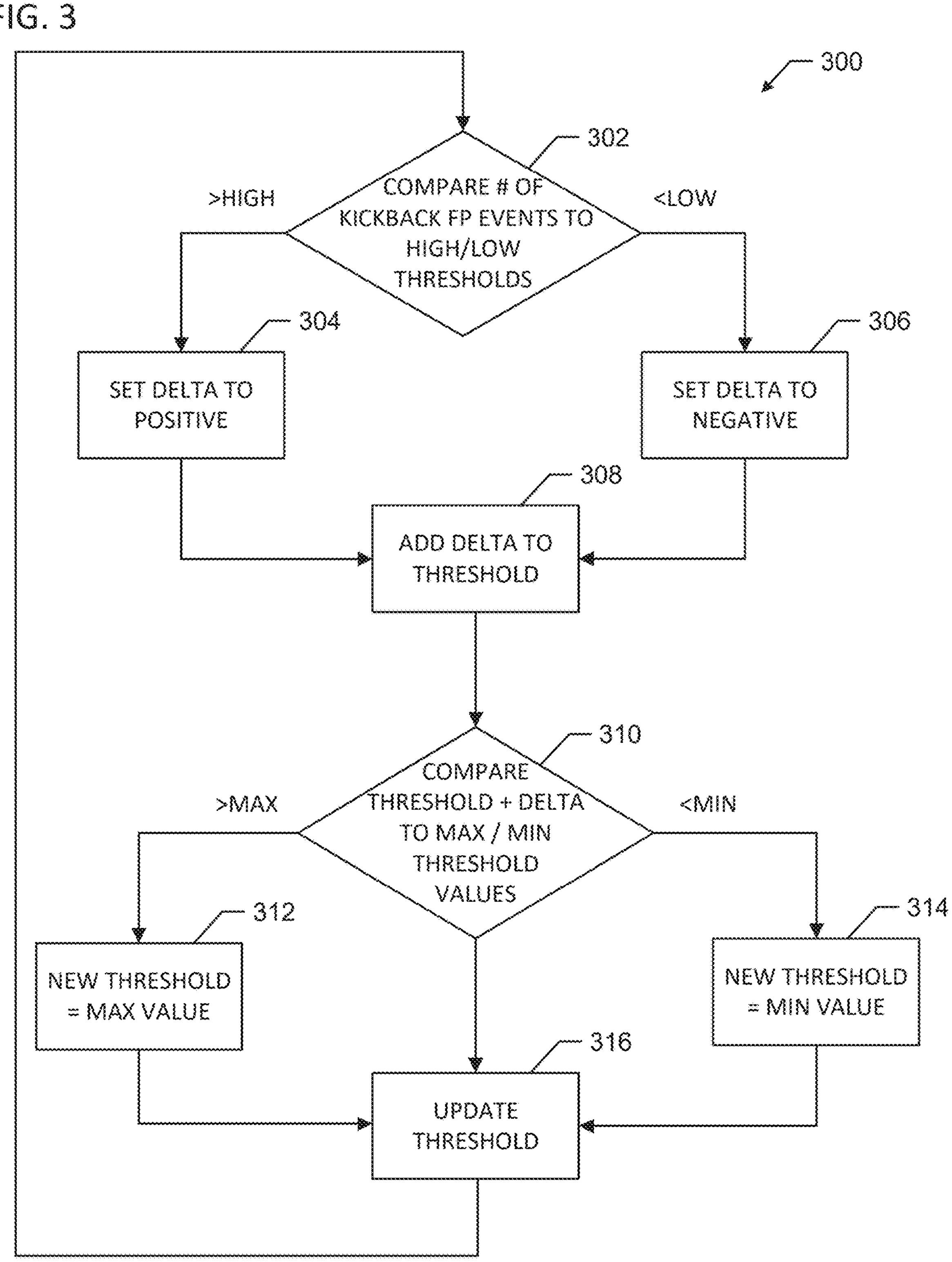
FIG. 3 provides an example flow diagram illustrating an example method for updating thresholds in an example system for providing kickback detection in power tools, in accordance with some embodiments of the present disclosure.

Reference will now be made to FIGS. 2 and 3 which provide flowcharts illustrating example steps, processes, procedures, and/or operations in accordance with various embodiments of the present disclosure. Various methods described herein, including, for example, example methods as shown in FIGS. 2 and 3, may provide various technical benefits and improvements. It is noted that each block of the flowchart, and combinations of blocks in the flowchart, may be implemented by various means such as hardware, firmware, circuitry and/or other devices associated with execution of software including one or more computer program instructions. For example, one or more of the procedures described in FIGS. 2 and 3 may be embodied by computer program instructions, which may be stored by a non-transitory memory of an apparatus employing an embodiment of the present disclosure and executed by a processor in the apparatus. These computer program instructions may direct a computer or other programmable apparatus to function in a particular manner, such that the instructions stored in the computer-readable storage memory produce an article of manufacture, the execution of which implements the function specified in the flowchart block(s).

As described above and as will be appreciated based on this disclosure, embodiments of the present disclosure may be configured as methods, mobile devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Similarly, embodiments may take the form of a computer program code stored on at least one non-transitory computer-readable storage medium. Any suitable computer-readable storage medium may be utilized including non-transitory hard disks, CD-ROMs, flash memory, optical storage devices, or magnetic storage devices.

Referring now to FIG. 2, an example a flow diagram illustrating an example method 200 for providing kickback detection in power tools, in accordance with some embodiments of the present disclosure is illustrated. In some embodiments, the example method 200 may be implemented by an example SIP, and primarily by an example FSM within the example SIP, of an example device described herein, including, but not limited to, the example SIP 120 and FSM 124 of the example device 100 described above in connection with FIG. 1.

The example method 200 shown in FIG. 2 begins when the trigger switch is depressed (or the power tool is otherwise actuated) and runs continuously while the power tool is operating. The example method 200 shown in FIG. 2 starts at step/operation 202. At step/operation 202, an FSM (such as, but not limited to, the FSM 124 of the SIP 120 of the device 100 described above in connection with FIG. 1) acquires the data used for kickback detection and confirmation. Specifically, the FSM 124 receives the input voltage (typically the battery voltage) (note: this is not the motor voltage), the input current (typically the battery current) (note: this is not the motor current), and the outputs from the IMU 122 (typically angular speed and acceleration for three axes (x, y, z)). In various embodiments, this data received at step/operation 202 is converted from analog to digital (such as via one or more ADCs) and filtered (such as via a low pass filter) to remove noise.

At step/operation 204, an FSM determines if the output from the IMU for any one of the axes exceeds one or more predetermined thresholds for at least a predetermined amount of time (T1). In various embodiments, the predetermined IMU threshold is related to the gyroscope that detects angular speed in degrees per second (dps). In one example embodiment, the predetermined IMU threshold is about +/−72 dps and the predetermined amount of time (T1) is about 10 milliseconds (ms) or 960 Hz. If it is determined at step/operation 204 that the output from the IMU for any one of the axes does exceed one or more predetermined thresholds for at least a predetermined amount of time (T1), the example method 200 proceeds to step/operation 206. In various embodiments, the output from the IMU for any one of the axes exceeding one or more predetermined thresholds for at least a predetermined amount of time is an indication of a kickback. However, in various embodiments, rather than shutting off the device based only on the data from the IMU, the kickback is confirmed using the input current or the input voltage.

At step/operation 206, an FSM determines if the input current exceeds one or more predetermined thresholds for at least a predetermined amount of time (T2). In one example embodiment, the predetermined input current threshold is about 20 amps and the predetermined amount of time (T2) is about 10 ms or 960 Hz. If it is determined at step/operation 206 that the input current does exceed one or more predetermined thresholds for at least a predetermined amount of time (T2), the example method 200 proceeds to step/operation 208. In various embodiments, the input current exceeding one or more predetermined thresholds for at least a predetermined amount of time confirms the indication of a kickback based on the data from the IMU.

At step/operation 208, an FSM generates a kickback interrupt. In various embodiments, this kickback interrupt is received by the MCU 108 which shuts off the device in response. The example method 200 returns to step/operation 202, waits for the device to be actuated again, and then continues to acquire data.

If it is determined at step/operation 206 that the input current does not exceed one or more predetermined thresholds for at least a predetermined amount of time (T2), the example method 200 proceeds to step/operation 210.

At step/operation 210, an FSM determines if the input voltage is less than one or more predetermined thresholds for at least a predetermined amount of time (T3). In one example embodiment, the predetermined input voltage threshold is about 2 volts and the predetermined amount of time (T2) is about 10 ms or 960 Hz. If it is determined at step/operation 210 that the input voltage is less than one or more predetermined thresholds for at least a predetermined amount of time (T3), the example method 200 proceeds to step/operation 208. In various embodiments, the input voltage being less than one or more predetermined thresholds for at least a predetermined amount of time confirms the indication of a kickback based on the data from the IMU. As described above, at step/operation 208, an FSM generates a kickback interrupt which is received by the MCU 108 which shuts off the device in response.

If it is determined at step/operation 210 that the input voltage is not less than one or more predetermined thresholds for at least a predetermined amount of time (T3), the example method 200 proceeds to step/operation 212. In various embodiments, if the input current does not exceed one or more predetermined thresholds for at least a predetermined amount of time and the input voltage is not less than one or more predetermined thresholds for at least a predetermined amount of time, the indication of a kickback based on the data from the IMU is not confirmed. That is, the kickback indication is a false positive. Because the kickback indication is not confirmed, the device is not shut off.

At step/operation 212, an FSM generates a false positive signal. In various embodiments, this false positive signal is added to a running count of such false positive signals, such as may be stored in the register 130. The example method 200 returns to step/operation 202 and continues to acquire data. In various embodiments, the running count of the false positive signals is used to consider modifying the thresholds used at step/operation 204, as described further in relation to FIG. 3. In various embodiments, other operational data may be stored in the register 130, such as the number of confirmed kickback events and the number of battery overload events.

If it is determined at step/operation 204 that the output from the IMU for any one of the axes does not exceed one or more predetermined thresholds for at least a predetermined amount of time (T1) (such that there is no kickback event detected), the example method 200 proceeds to step/operation 214. At step/operation 214, an FSM determines if the input current exceeds one or more predetermined thresholds and the input voltage is less than one or more predetermined thresholds for at least a predetermined amount of time (Tovl). In various embodiments, this would indicate a battery overload. In one example embodiment, the predetermined amount of time (Tovl) is about 1 second. If it is determined at step/operation 214 that the input current does not exceed one or more predetermined thresholds and/or the input voltage is not less than one or more predetermined thresholds for at least a predetermined amount of time (Tovl), the example method 200 returns to step/operation 202 and continues to acquire data.

If it is determined at step/operation 214 that the input current does exceed one or more predetermined thresholds and the input voltage is less than one or more predetermined thresholds for at least a predetermined amount of time (Tovl), the example method 200 proceeds to step/operation 216. At step/operation 216, an FSM (such as, but not limited to, the FSM 124 of the SIP 120 of the device 100 described above in connection with FIG. 1) generates a battery overload interrupt. In various embodiments, this battery overload interrupt is received by the MCU 108 which shuts off the device in response.

Referring now to FIG. 3, an example a flow diagram illustrating an example method 300 for updating thresholds in an example system for providing kickback detection in power tools, in accordance with some embodiments of the present disclosure is illustrated. In some embodiments, the example method 300 may be implemented by an example SIP, and primarily by an example MLC within the example SIP, of an example device described herein, including, but not limited to, the example SIP 120 and MLC 126 of the example device 100 described above in connection with FIG. 1. In various embodiments, the MLC 126 runs any suitable machine learning model, such as a decision tree model. Alternatively, the example method 300 may be implemented by an example FSM, such as the FSM 124 of the example device 100 described above in connection with FIG. 1.

The example method 300 shown in FIG. 3 begins when the device is activated and runs continuously while the device is activated. The example method 300 shown in FIG. 3 starts at step/operation 302. At step/operation 302, an MLC (such as, but not limited to, the MLC 126 of the SIP 120 of the device 100 described above in connection with FIG. 1) compares the number of kickback false positive events (which may be stored in a register, as described above) to a predetermined high threshold and/or a predetermined low threshold. In various embodiments, if the number of kickback false positive events exceeds a predetermined high threshold, this is indicative of the IMU threshold being set too low (i.e., the kickback detection is too sensitive). Conversely, if the number of kickback false positive events is less than a predetermined low threshold, this is indicative of the IMU threshold being set too high (i.e., the kickback detection is not sensitive enough).

If it is determined at step/operation 302 that the number of kickback false positive events exceeds the predetermined high threshold, the example method 300 proceeds to step/operation 304. At step/operation 304, an MLC sets a predetermined delta value to positive. In one example embodiment, the predetermined delta value is five percent of the initial IMU threshold value. The example method 300 then proceeds to step/operation 308.

If it is determined at step/operation 302 that the number of kickback false positive events is less than the predetermined low threshold, the example method 300 proceeds to step/operation 306. At step/operation 306, an MLC sets the predetermined delta value to negative. The example method 300 then proceeds to step/operation 308.

At step/operation 308, an MLC adds the predetermined delta value to the current IMU threshold value (which may be the initial IMU threshold value if this is the first time the IMU threshold value has been adjusted or the most recently adjusted IMU threshold value). If the predetermined delta value was set to positive at step/operation 304, then the IMU threshold value is increased at step/operation 308. Conversely, if the predetermined delta value was set to negative at step/operation 306, then the IMU threshold value is decreased at step/operation 308. The example method 300 then proceeds to step/operation 310.

At step/operation 310, an MLC compares the value determined at step/operation 308 (i.e., current IMU threshold value plus the positive or negative predetermined delta value) to a predetermined maximum IMU threshold value and a predetermined minimum IMU threshold value. In various embodiments, this ensures that the IMU threshold value stays within a predetermined range.

If it is determined at step/operation 310 that the value determined at step/operation 308 exceeds the predetermined maximum IMU threshold value, the example method 300 proceeds to step/operation 312. At step/operation 312, an MLC sets the new, adjusted IMU threshold value to the predetermined maximum IMU threshold value. The example method 300 then proceeds to step/operation 316.

If it is determined at step/operation 310 that the value determined at step/operation 308 is less than the predetermined minimum IMU threshold value, the example method 300 proceeds to step/operation 314. At step/operation 314, an MLC sets the new, adjusted IMU threshold value to the predetermined minimum IMU threshold value. The example method 300 then proceeds to step/operation 316.

At step/operation 316, an MLC provides the new, updated IMU threshold value to the FSM to be used in the example method 200 for determining if a kickback event has occurred. In various embodiments, the running count of the false positive signals is reset to zero.

In various embodiments, the machine learning model may, in addition to adjusting the IMU threshold, adjust the times used in the algorithm (T1, T2, T3). In various embodiments, the machine learning model may consider more than just the number of false positives when adjusting the IMU threshold. For example, the machine learning model may consider the input voltage, the input current, the motor voltage, and/or the motor current.

In various embodiments, a convergence check may be continuously or periodically performed. In various embodiments, a convergence check involves monitoring the number of false kickback events over time. If the number of false kickback events stabilizes within the predefined high and low range, the algorithm has converged.

In various embodiments, a log of threshold adjustments and the number of kickback events may be maintained. In various embodiments, if the number of kickback events is high, power to the motor may be limited.

CONCLUSION

Many modifications and other embodiments of the disclosures set forth herein will come to mind to one skilled in the art to which these disclosures pertain having the benefit of teachings presented in the foregoing descriptions and the associated drawings. Although the figures only show certain components of the apparatus and systems described herein, it is understood that various other components may be used in conjunction with the system. Therefore, it is to be understood that the disclosures are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the disclosure(s) set out in any claims that may issue from this disclosure.

While this detailed description has set forth some embodiments of the present disclosure, the appended claims cover other embodiments of the present disclosure which differ from the described embodiments according to various modifications and improvements. For example, the appended claims can cover any form of power tool which has an IMU and kickback detection. Additionally, the appended claims can cover any device which has an electric motor which causes rotational or linear motion and which may experience kickback. Such additional example include but are not limited to: automotive safety systems (e.g., traction control systems); industrial machinery (e.g., robotic arms and CNC machines); consumer electronics (e.g., drones); medical devices (e.g., surgical robots); construction equipment (e.g., excavators, bulldozers, cranes); sports equipment (e.g., smart helmets); and fitness equipment (e.g., treadmills and other exercise machines).

Within the appended claims, unless the specific term "means for" or "step for" is used within a given claim, it is not intended that the claim be interpreted under 35 U.S.C. 112, paragraph 6.

What is claimed is:

1. A method for confirming kickback, the method comprising:

in response to an indication of a kickback occurrence, comparing an input current to a predetermined current threshold;

when the input current is greater than the predetermined current threshold for a first predetermined amount of time, generating a kickback interrupt signal;

when the input current is not greater than the predetermined current threshold, comparing an input voltage to a predetermined voltage threshold;

when the input voltage is less than the predetermined voltage threshold for a second predetermined amount of time; generating a kickback interrupt signal; and when the input voltage is not less than the predetermined voltage threshold and the input current is not greater than the predetermined current threshold, generating a false positive (FP) signal.

2. The method of claim 1, wherein the input current comprises a battery current or an alternating current (AC) line current; and the input voltage comprises a battery voltage or an AC line voltage.

3. The method of claim 1, wherein the indication of a kickback occurrence is based on one or more outputs from an inertial measurement unit (IMU).

4. The method of claim 3, wherein the indication of a kickback occurrence is based on at least one of the one or more outputs from the IMU being greater than a predetermined IMU threshold for a third predetermined amount of time.

5. The method of claim 4, wherein the one or more outputs from the IMU comprise three outputs; and wherein each of the three outputs corresponds to an axis.

6. The method of claim 4, further comprising:

maintaining a running total of the generated FP signals.

7. The method of claim 6, further comprising:

comparing the running total of the generated FP signals to a first FP threshold; and when the running total of the generated FP signals is greater than the first FP threshold, determining an adjusted value of the predetermined IMU threshold by adding a respective predetermined delta to the predetermined IMU threshold.

8. The method of claim 7, further comprising:

comparing the running total of the generated FP signals to a second FP threshold; and when the running total of the generated FP signals is less than the second FP threshold, determining an adjusted value of the predetermined IMU threshold by subtracting a respective predetermined delta from the predetermined IMU threshold.

9. The method of claim 8, further comprising:

when the running total of the generated FP signals is greater than the first FP threshold and the determined adjusted value of the predetermined IMU threshold is greater than a predetermined maximum value, setting the predetermined IMU threshold to the predetermined maximum value; and when the running total of the generated FP signals is less than the second FP threshold and the determined adjusted value of the predetermined IMU threshold is less than a predetermined minimum value, setting the predetermined IMU threshold to the predetermined minimum value.

10. The method of claim 6, further comprising:

comparing the running total of the generated FP signals to a first FP threshold; and when the running total of the generated FP signals is greater than the first FP threshold, applying an artificial intelligence data model to determine an adjusted value of the predetermined IMU threshold.

11. A device for confirming kickback, the device comprising:

an inertial measurement unit (IMU); and a finite state machine configured to:

compare one or more outputs from the IMU to a predetermined IMU threshold;

when any one of the one or more outputs from the IMU is greater than the predetermined IMU threshold for a first predetermined amount of time, compare an input current to a predetermined current threshold;

when the input current is greater than the predetermined current threshold for a second predetermined amount of time, generate a kickback interrupt signal;

when the input current is not greater than the predetermined current threshold, compare an input voltage to a predetermined voltage threshold;

when the input voltage is less than the predetermined voltage threshold for a third predetermined amount of time; generate a kickback interrupt signal; and when the input voltage is not less than the predetermined voltage threshold for the third predetermined amount of time and the input current is not greater than the predetermined current threshold for the second predetermined amount of time, generate a false positive (FP) signal.

12. The device of claim 11, wherein the input current comprises a battery current or an alternating current (AC) line current; and the input voltage comprises a battery voltage or an AC line voltage.

13. The device of claim 11, wherein the one or more outputs from the IMU comprise three outputs; and wherein each of the three outputs corresponds to an axis.

14. The device of claim 11, further comprising:

a register to maintain a running total of the generated FP signals.

15. The device of claim 14, further comprising:

a machine learning core (MLC) configured to:

compare the running total of the generated FP signals to a first FP threshold; and when the running total of the generated FP signals is greater than the first FP threshold, determine an adjusted value of the predetermined IMU threshold by adding a respective predetermined delta to the predetermined IMU threshold.

16. The device of claim 15, wherein the MLC is further configured to:

compare the running total of the generated FP signals to a second FP threshold; and when the running total of the generated FP signals is less than the second FP threshold, determine an adjusted value of the predetermined IMU threshold by subtracting a respective predetermined delta from the predetermined IMU threshold.

17. The device of claim 16, wherein the MLC is further configured to:

when the running total of the generated FP signals is greater than the first FP threshold and the determined adjusted value of the predetermined IMU threshold is greater than a predetermined maximum value, set the predetermined IMU threshold to the predetermined maximum value; and when the running total of the generated FP signals is less than the second FP threshold and the determined adjusted value of the predetermined IMU threshold is less than a predetermined minimum value, set the predetermined IMU threshold to the predetermined minimum value.

18. The device of claim 14, further comprising:

a machine learning core (MLC) configured to:

compare the running total of the generated FP signals to a first FP threshold; and when the running total of the generated FP signals is greater than the first FP threshold, apply an artificial intelligence data model to determine an adjusted value of the predetermined IMU threshold.

* * * * *